(12) United States Patent
Takahashi (10) Patent No.: US 6,259,623 B1
(45) Date of Patent: Jul. 10, 2001

(54) STATIC RANDOM ACCESS MEMORY (SRAM) CIRCUIT

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/595,619

(22) Filed: Jun. 16, 2000

(30) Foreign Application Priority Data

Jun. 17, 1999 (JP) .................................................. 11-170476

(51) Int. Cl.$^7$ .................................................. G11C 13/00
(52) U.S. Cl. ...................................... 365/154; 365/230.01
(58) Field of Search .............................. 365/154, 189.01, 365/230.01

(56) References Cited

U.S. PATENT DOCUMENTS 6,172,899 * 1/2001 Marr et al. ............................ 365/154

FOREIGN PATENT DOCUMENTS 5-62474 3/1993 (JP) .
8-287691 11/1996 (JP) .

* cited by examiner

*Primary Examiner*—Terrell W. Fears
(74) *Attorney, Agent, or Firm*—Darryl G. Walker

(57) ABSTRACT

A static random access memory (SRAM) circuit includes four-transistor memory cells and is capable of high-speed reliable read operations. According to one embodiment, a SRAM circuit includes "n" memory cells (200-1 to 200-n) connected to digit line pairs (202-0 and 202-1). When selected, a memory cell (200-1 to 200-n) can draw an on current (Ion). When deselected, a memory cell (200-1 to 200-n) can draw a leakage current (Ioff) that can maintain a data value stored in a memory cell. High-speed and reliable operations may be achieved by meeting the following relationship:

$$Ion > K*(n-1)*Ioff,$$

where K is 1 or more.

20 Claims, 4 Drawing Sheets

STATIC RANDOM ACCESS MEMORY (SRAM) CIRCUIT

TECHNICAL FIELD

The present invention relates generally to static random access memory (SRAM) circuits, and more particularly to SRAM circuits that include memory cells with four transistors.

BACKGROUND OF THE INVENTION

A continuing goal for semiconductor memory devices has been to increase storage capacity while not increasing overall device size. Decreases in device size can be accomplished with improvements in process technology that allowing generational "shrinks" of existing designs. Such approaches, however, typically provide only incremental reductions in device size.

An even more desirable way of decreasing device size is to arrive at some way of reducing the number of circuit devices (e.g., transistors, resistors, capacitors) in a memory cell. Decreasing the number of circuit devices can lead to a much higher degree of memory cell integration, thereby allowing for significant increases in storage capacity without increases in overall device size.

One particular type of memory device where increased cell integration continues to be a valuable goal is the static random access memory (SRAM). A conventional SRAM cell may typically include a pair of driver transistors, a pair of access transistors, and a pair of load devices.

One version of a conventional SRAM cell is the six transistor (6-T) cell. In a 6-T cell transistors are used as load devices. Other versions of such a conventional SRAM cell may include resistors as load devices. While memory cells that include resistors as load devices are often referred to as "4-T" cells, to avoid confusion with the type of memory cell discussed in more depth below, such four transistor, two resistor-type memory cells will also be referred to as 6-T cells. In both types of conventional 6-T cells, load transistors/resistors maintain nodes within the memory cell at complementary potentials. In a read operation, such complementary potentials can be placed on digit lines to generate a differential voltage. When such a differential voltage reaches a predetermined potential, the differential voltage can be amplified by a sense amplifier.

In conventional 6-T type memory cells, greater integration has included increasing the number of memory cells that are connected to digit lines, resulting in longer digit lines. However, such an approach increases the load capacitance of such digit lines. Consequently, the time required for digit lines to develop a sufficient differential voltage for a sense amplifier can be longer. This can limit the read operation speeds for such semiconductor memory devices. One approach to address such a drawback is set forth in Japanese Unexamined Patent Application No. 8-287691. Japanese Unexamined Patent Application No. 8-287691 discloses an SRAM circuit having six-transistor memory cells connected to digit lines that are disposed in a latitudinal direction, but divided in the longitudinal direction, to thereby reduce the load capacitance of the resulting digit line segments.

In an attempt to arrive at greater device integration, a "true" four-transistor SRAM memory cell has been proposed. Such a SRAM memory cell does not include load devices, and will be referred to herein as a four-transistor memory cell. A four-transistor memory cell an provide significant increases in integration by reducing the number of circuit devices per cell by one third over 6-T cell approaches. One example of a four-transistor type memory is shown in Japanese Unexamined Patent Application No. 5-62474.

Figure 3:
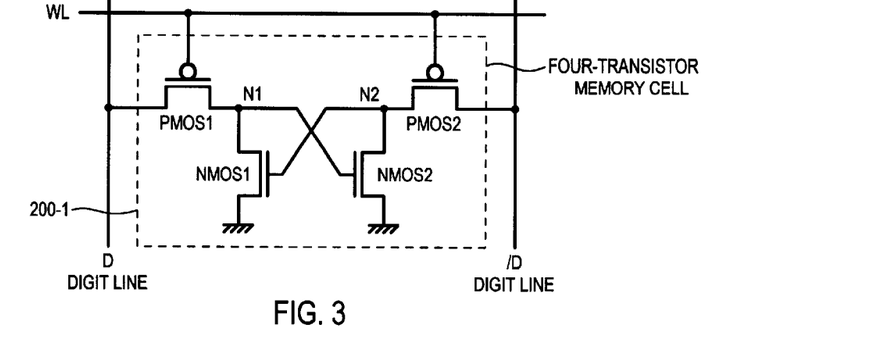
FIG. 3 is a schematic diagram of a four-transistor memory cell.

Referring now to FIG. 3 a four-transistor memory cell is shown in a schematic diagram. A four-transistor memory cell may include two driver transistors NMOS1 and NMOS2 arranged in a flip-flop configuration. That is, the drain of driver transistor NMOS1 can be connected to gate of driver transistor NMOS2, while the drain of driver transistor NMOS2 can be connected to the gate of driver transistor NMOS1. The sources of driver transistors NMOS1 and NMOS2 can be connected to a common potential, ground (GND) for example. A four-transistor memory cell may further include two access transistors PMOS1 and PMOS2. Access transistor PMOS1 can have a source connected to a digit line D and a drain connected to the drain of driver transistor NMOS1 at a node N1. Access transistor PMOS2 can have a source connected to a digit line /D and a drain connected to the drain of driver transistor NMOS2 at a node N2. Access transistors (PMOS1 and PMOS2) can have gates that are commonly connected to the same word line WL.

In a read operation for the above-described four-transistor memory cell, a word line WL can be set to a low potential to select a memory cell. With a word line WL low, access transistors PMOS1 and PMOS2 can be turned on connecting nodes N1 and N2 to digit lines D and /D, respectively. A difference in potential at nodes N1 and N2 can be placed on digit lines D and /D and amplified by a sense amplifier (not shown). In this way, data can be read from a four-transistor memory cell.

In a write operation for the four-transistor memory cell of FIG. 3, a word line WL can be set to a low potential to select a memory cell. With a word line WL low, access transistors PMOS1 and PMOS2 can connect nodes N1 and N2 to digit lines D and /D, respectively. In this state, a node (N1 or N2) in a SRAM cell can be driven high by way of a digit line D or /D. In the event the node was previously at a low potential, the node can be charged through a corresponding access transistor (PMOS1 or PMOS2), thereby "toggling" the SRAM memory cell to store the desired logic value.

In the four-transistor memory cell of FIG. 3, data may be retained by supplying power to a digit line (D or /D) with a precharge transistor (not shown). With power supplied to a digit line, a subthreshold leakage current can pass across the source-drain path of an access transistor (PMOS1 of PMOS2) and thereby maintain a corresponding storage node (N1 or N2) at a high potential. As one particular example, if reference is made again to FIG. 3, if it is assumed that node N1 is at a high potential with respect to node N2, driver transistor NMOS2 can provide a relatively low resistance path between the ground potential and node N2. Node N1 can be maintained at a high potential by a subthreshold leakage current (Ioff) flowing through access transistor PMOS1. This is in contrast to a six-transistor memory cell arrangement where node potentials are maintained by load transistors/resistors within each memory cell.

While four-transistor memory cells provide for the possibility of SRAM devices of greater density, it not believed that conventional approaches to such devices have yielded practical results.

Experimentation on four-transistor memory cell SRAM devices have been performed. In particular, read and write operations for such a device have been examined. It has been found that conventional approaches to four-transistor SRAM devices do not appear to generate a sufficient potential difference between digit lines to obtain read operations that are reliable and/or fast enough.

Experimentation has also be been performed on four-transistor memory cell SRAM devices that include segmented digit lines as shown in Japanese Unexamined Patent Application No. 8-287691 described above. Such experimentation has revealed that such an conventional approach may still suffer from the drawbacks noted above. Namely, a sufficient potential difference between digit lines may not be generated, preventing reliable read operations and/or a read operations that are slower than desired.

It would be desirable to arrive at some way of implementing a four-transistor SRAM circuit that can provide more reliable and faster read operations than conventional approaches.

SUMMARY OF THE INVENTION

The embodiments of the present invention provide a static random access memory (SRAM) circuit that includes a number of memory cells. The memory cells can include a pair of driver transistors and a pair of access transistors. A number "n" of memory cells can be connected to the same digit line pair. Memory cells are designed and connected to the same digit line pair to satisfy the relationship Ion>K*(n−1)*Ioff (Expression 1), where Ion is the current drawn by a selected memory cell, K is a coefficient that can be greater than or equal to one, n is the number of memory cells connected to the same digit line pair, and Ioff is the leakage current drawn by a de-selected memory cell.

According to one aspect of the embodiments, the SRAM device can include digit line pairs that are divided in the longitudinal direction to satisfy Expression 1.

According to another aspect of the embodiments, each SRAM cell can include n-channel insulated gate field effect (IGFET) driver transistors having cross-coupled gates and drains.

According to another aspect of the embodiments, each SRAM cell can include two nodes that can store complementary data values and p-channel IGFET access transistors that connect the two nodes to a digit line pair.

According to another aspect of the embodiments, the gates of the access transistors can be commonly connected to a word line.

According to another aspect of the embodiments, the coefficient K of Expression 1 can be in the general range of 1 to 10.

According to another aspect of the embodiments, in an SRAM circuit read operation a selected memory cell can draw a current Ion on a digit line while de-selected memory cells draw a current Ioff. Provided the relationship of Expression 1 is met, a sufficient differential voltage can be generated on a digit line pair to enable reliable and fast sensing of data values. In contrast, if the relationship of Expression 1 is not met, the voltage differential generated on digit line pairs may not be sufficient for sensing and/or may actually generate an erroneous differential voltage.

DETAILED DESCRIPTION OF THE EMBODIMENTS

The present invention will now be described in detail with reference to a number of drawings.

Figure 1:
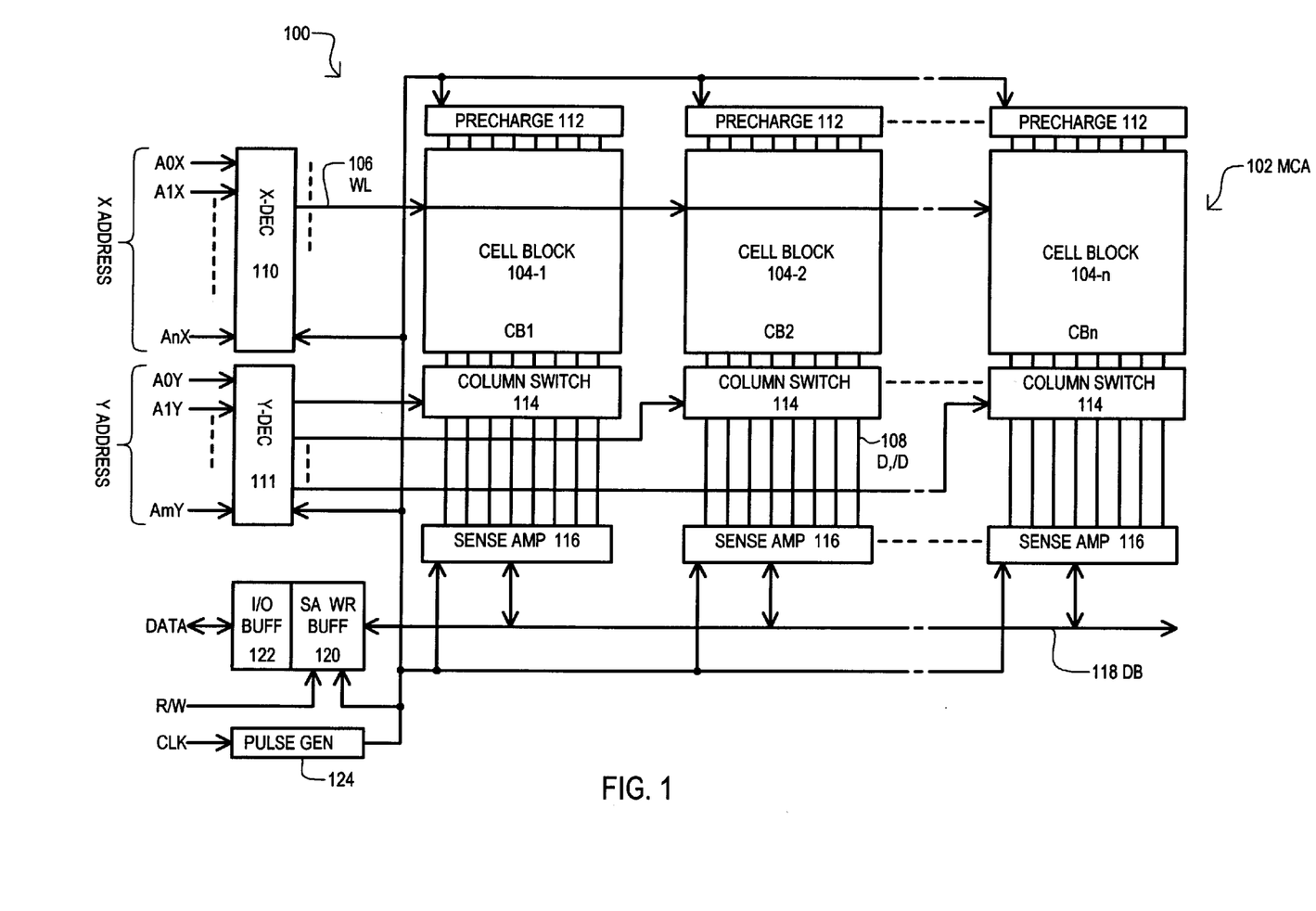
FIG. 1 is block diagram of a static random access memory (SRAM) device according to one embodiment of the present invention.

Referring now to FIG. 1, a block diagram is set forth illustrating a static random access memory (SRAM) circuit according to the present invention. The SRAM circuit is designated by the general reference character 100 and is shown to include a memory cell array MCA 102 having a number of four-transistor memory cells arranged in X and Y directions. A memory cell array 102 may be further arranged into "n" cell blocks (CB1 to CBn), shown as 104-1 to 104-n. Each cell block (104-1 to 104-n) is connected to a number of word lines WL, one of which is shown as item 106. The cell blocks (104-1 to 104-n) may also be connected to a number of digit line pairs (D and /D), one of which is shown as item 108.

The SRAM circuit 100 may further include an X-decoder (XDEC) 110. An X-decoder 110 can receive an X-address (A0X to AnX) and generate an X-select signal on a selected word line (such as 106). In one particular arrangement (e.g., four-transistor memory cells with p-channel access transistors), an X-select signal can drive a selected word line to a low potential.

Digit line pairs (such as 108) can be connected to a precharge circuit 112, a column witch circuit 114, and a sense amplifier circuit 116. It is understood that the number of digit lines in a cell block (104-0 to 104-n) may be different than the number of digit lines between a column switch circuit 114 and corresponding sense amplifier circuit 116. That is, in one arrangement a column switch circuit 114 can connect each digit line pair from a sense amplifier circuit 116 to a corresponding digit line pair in a cell block (104-0 to 104-n). However, in another arrangement, a column switch circuit 114 can connect one digit line pair from a sense amplifier circuit 116 to a digit line pair selected from a group of digit line pairs in a cell block (104-0 to 104-n).

A Y-decoder 111 can receive a Y-address (A0Y to AmY) and generate a Y-select signal for column switch circuit 114. A Y-select signal can result in a column switch circuit 114 connecting a digit line pair from a cell block (104-0 to 104-n) to a sense amplifier circuit 116. A sense amplifier circuit 116 can then amplify a potential difference on a digit line pair.

A sense amplifier circuit 116 can be connected to a data bus 118. A data bus 118 can be connected to a sense amplifier (SA) write buffer 120 and an input/output (I/O) buffer 122. A SA write buffer 120 can receive a read/write signal (R/W). In one particular arrangement, in a read mode, data can be output by way of I/O buffer 122. In a write mode, data can be input by way of I/O buffer 122 and amplified by SA write buffer 120.

FIG. 1 further includes a pulse generator circuit 124 that can receive a clock signal CLK and generate an internal clock signal that can control the timing of the various other circuits within SRAM circuit 100.

It is noted that column switch circuit 114 may include, separately and/or inherently, precharge circuits. Thus, column switch circuit 114 may also maintain digit line pairs (such as 108) at a predetermined potential. Further, an embodiment that includes a column switch circuit 114 having a precharge function may or may not include a separate precharge circuit, such as 112.

Figure 2:
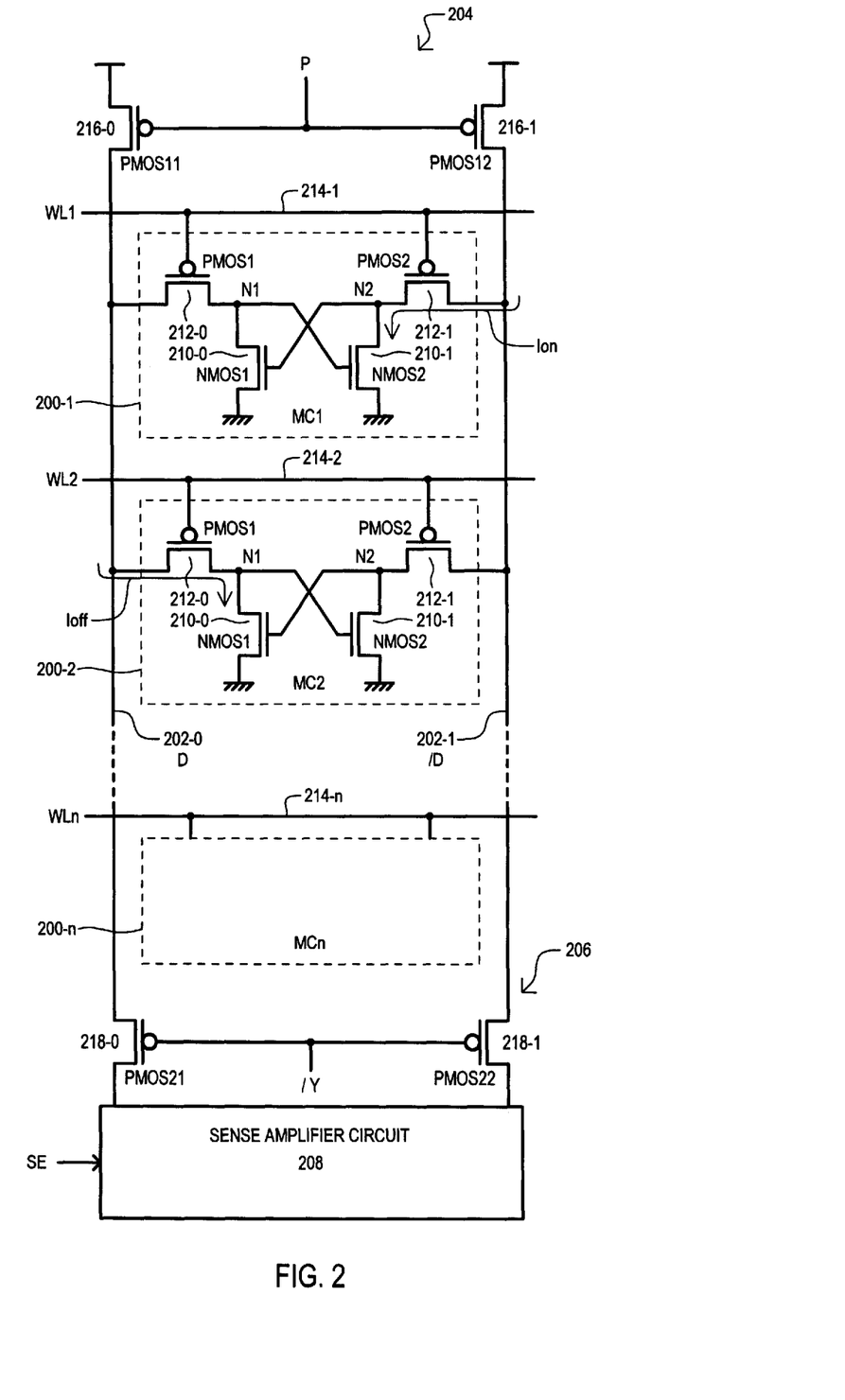
FIG. 2 is a circuit diagram showing a digit line pair and associated circuits according to one embodiment of the present invention.

Referring now to FIG. 2, a circuit diagram is shown illustrating a digit line pair and corresponding circuits according to one embodiment. FIG. 2 shows a number of memory cells (MC1 to MCn) 200-1 to 200-n connected to a digit line pair (D and /D) 202-0 and 202-1. FIG. 2 also shows a precharge circuit 204 and column switch circuit 206 connected to the digit line pair (202-0 and 202-1). A sense amplifier circuit 208 can be connected to the column switch circuit 206. In one particular arrangement, the structure of FIG. 2 can be repeated to form a memory cell block, such as those shown as 104-1 to 104-n in FIG. 1.

Memory cells (200-1 to 200-n) of FIG. 2 may each include a pair of driver transistors (NMOS1 and NMOS2) 210-0 and 210-1 and a pair of access transistors (PMOS1 and PMOS2) 212-0 and 212-1. In the particular arrangement of FIG. 2, driver transistors (210-0 and 210-1) can be n-channel transistors and access transistors (212-0 and 212-1) can be p-channel transistors. Driver transistors (210-0 and 210-1) can be connected in a latch-type arrangement, having cross-coupled gates and drains. The sources of driver transistors (210-0 and 210-1) can be connected to a predetermined potential, for example ground. An access transistor 212-0 can be connected between a node N1 formed at the cross-coupled drain connection of driver transistor 212-0 and digit line 202-0. An access transistor 212-1 can be connected between a node N2 formed at the cross-coupled drain connection of driver transistor 212-1 and digit line 202-1. The gates of access transistors (212-0 and 212-1) can be connected to the same word line WL (214-1 to 214-n).

In the arrangement of FIG. 2, a precharge circuit 204 can include two precharge transistors (PMOS11 and PMOS12) 216-0 and 216-1. In one arrangement, precharge transistors (216-0 and 216-1) can be p-channel transistors. Precharge transistors (216-0 and 216-1) can have source-drain paths arranged in series between corresponding digit lines (202-0 and 202-1) and a high potential, such as a power supply potential. The gates of precharge transistors (216-0 and 216-1) can be commonly connected to a precharge signal P. In FIG. 2, when the precharge signal P transitions low, precharge transistors (216-0 and 216-1) can be turned on.

The column switch circuit 206 of FIG. 2 is shown to include two switch transistors (PMOS21 and PMOS22) 218-0 and 218-1. In one particular arrangement, switch transistors (218-0 and 218-1) can be p-channel transistors. The gates of the switch transistors (218-0 and 218-1) can be commonly connected to a Y-select signal /Y. In the arrangement of FIG. 2, when the /Y signal is low, a digit line pair (202-0 and 202-1) can be connected to sense amplifier circuit 208.

A sense amplifier circuit 208 can amplify a voltage differential on a digit line pair (202-0 and 202-1) according to a sense amplifier enable signal SE. In this way, the potential difference generated on the digit line pair (202-0 and 202-1) by a selected memory cell (200-1 to 200-n) can be read out from the SRAM device.

Having described a SRAM circuit 100 in FIG. 1 and portions thereof in FIG. 2, the operation of an SRAM circuit according to one embodiment will now be described. Referring now to FIG. 1, to select a memory cell (for a read or write operation, for example) an X-address (A0X to AnX) can be applied to X-decoder 110 resulting in a selected word line 106 being activated (driven low, for example). In addition, a Y-address (A0Y to AmY) can be applied to Y-decoder 111 and a Y-select signal /Y can be activated (driven low, for example). The activated Y-select signal /Y can result in the column switch circuit 114 connecting a selected digit line pair (such as 108) to a sense amplifier circuit 116.

When a memory cell is not selected, a precharge signal P can be active (low, for example). An active precharge signal P can enable a precharge circuit 112, resulting in a precharge voltage being applied to digit line pairs. At the same time, the column switch circuit 114 is inactive, isolating digit line pairs from sense amplifier circuit 116. In such a state, the data stored in the memory cells can be maintained by a leakage current provided to the digit lines by the precharge circuit 112.

If reference is made to FIG. 2 and FIG. 1, in a write operation, a word line (214-1 to 214-n) of a selected memory cell (200-1 to 200-n) can be driven low to turn on the access transistors (212-0 and 212-1) of the selected memory cell (200-1 to 200-n). Nodes N1 and N2 of the selected memory cell (200-1 to 200-n) can thus be connected to digit lines 202-0 and 202-1, respectively.

Further, during a write operation, precharge circuit 204 is turned off and column switch circuit 206 can connect a digit line pair (202-0 and 202-1) to a sense amplifier circuit 208. In addition, according to a R/W signal, data input to an I/O buffer 122 can be driven on data bus 118 by SA buffer 120. According to the value on data bus 118, a sense amplifier circuit 208 can drive digit lines (202-0 and 202-1) to store a data value in a selected memory cell (200-1 to 200-n). For example, if a selected memory cell (200-1 to 200-n) stores a value different than that being written, a node (N1 or N2) that is charged can be discharged by a digit line (202-0 or 202-1) that is driven low by sense amplifier circuit 208, and the other node (N2 or N1) that is discharged can be charged by a digit line (202-1 or 202-0). In this way, data can be written into a four-transistor memory cell. Of course, a sense amplifier could drive one digit line (202-0 or 202-1) high, and rely on a driver transistor within a elected memory cell to discharge a node (N2 or N1) within the selected memory cell.

In a read operation, a word line (214-1 to 214-n) of a selected memory cell (200-1 to 200-n) can be driven low to turn on the access transistors (212-0 and 212-1) of the selected memory cell (200-1 to 200-n). Nodes N1 and N2 of the selected memory cell (200-1 to 200-n) can be connected to digit lines 202-0 and 202-1, respectively. The difference in potential between nodes N1 and N2 can generate a voltage differential between digit lines 202-0 and 202-1. This voltage differential can be amplified by a sense amplifier circuit 208.

In the arrangement described above, "n" memory cells (200-1 to 200-n) are connected to a digit line pair (202-0 and 202-1). The present invention may be better understood with reference to a relationship described in an equation below.

$$Ion > K * (n-1) * Ioff \qquad \text{(Expression 1)}$$

In the above expression, "Ion" is a current drawn on a digit line by a selected memory cell. Ioff is a leakage current drawn on a digit line by a non-selected memory cell. The value "n" is the number of memory cells connected to a digit line pair. A value "K" is determined by the characteristics of a driver transistor and access transistor of a memory cell. In one embodiment, K can depend upon the "on" current of these devices, and may be a value of 1 or greater.

Expression (1) shown above will now be described with reference to FIG. 2 by way of an example. First, it will be assumed that memory cell 200-1 stores a logic 1 (i.e., its node N1 is high while its node N2 is low) and memory cell 200-2 stores a logic 0 (i.e., its node N1 is low while its node N2 is high). It is then assumed that memory cell 200-1 is selected and the remaining memory cells 200-2 to 200-n are de-selected. In this state, selected memory cell 200-1 will draw an on current (Ion) by way of access transistor 212-1 and driver transistor 210-1. This can result in digit line 202-1 falling in potential.

At the same time, within de-selected memory cell 200-2, the high potential at node N2 can turn on driver transistor 210-0. Consequently, a leakage current (Ioff) can be drawn by way of access transistor 212-0 and driver transistor 210-0 within de-selected memory cell 200-2. Such a leakage current (Ioff), particularly when compounded by similar leakage currents from other de-selected memory cells, can result in an undesirable drop in potential on digit line 202-0.

Consequently, in a read operation, a selected memory cell storing one logic value can draw a current Ion on a first digit line while de-selected memory cells storing an opposite logic value can draw a current Ioff on the other digit line. Further, in a "worst case" situation (i.e., where a selected memory cell stores one logic value while the remaining de-selected memory cells on the same digit lines store an opposite logic value) one digit line may draw the current Ion while the other digit line draws a current $Ioff*(n-1)$.

In this way, the current Ion from a selected memory cell and the currents Ioff from de-selected memory cells can determine the differential voltage on a digit line pair that is subsequently amplified by a sense amplifier circuit.

It is further noted that when no memory cells (200-1 to 200-n) are being accessed, the digit lines (202-0 and 202-1) can be precharged to a high potential which can maintain the logic values stored in the various memory cells. For example, assume again that memory cell 200-1 stores a logic 1 and memory cell 200-2 stores a logic 0. When all the memory cells (200-1 to 200-n) are de-selected and precharge circuit 204 is active, digit lines 202-0 and 202-1 can be precharged to a high potential. A leakage current through access transistor 212-0 of memory cell 200-1 can maintain node N1 therein high. Conversely, a leakage current through access transistor 212-1 of memory cell 200-2 can maintain node N2 therein high. In this way, data values stored within memory cells (200-1 to 200-n) can be maintained by a precharge circuit 204.

Figure 4:
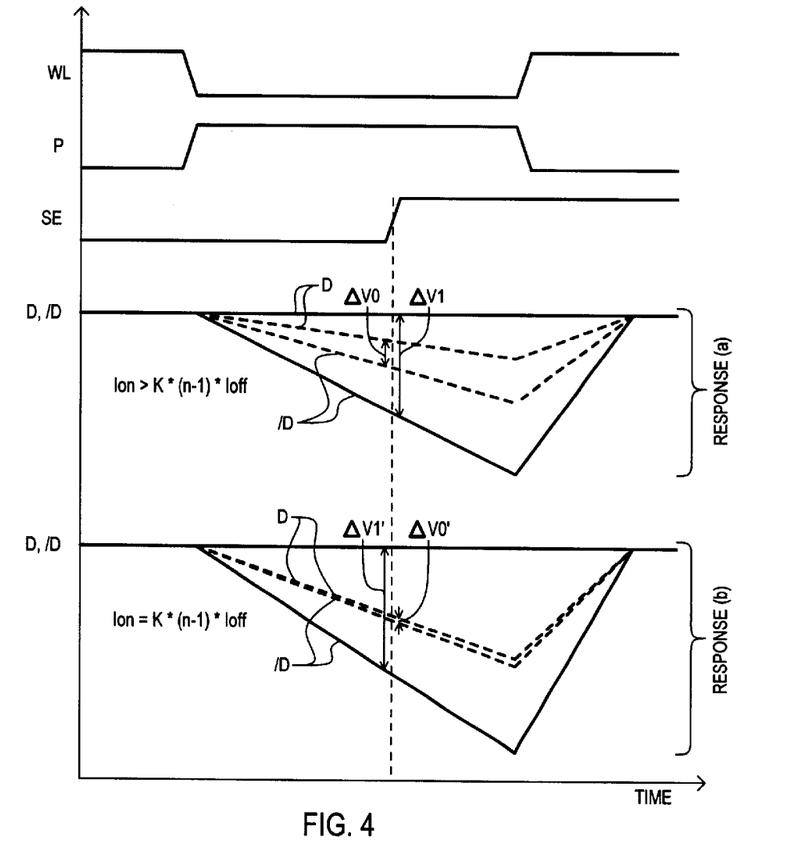
FIG. 4 is a timing diagram illustrating read operations for a SRAM device according to one embodiment and a conventional four-transistor SRAM device.

FIG. 4 includes various potentials and signals involved in a read operation including a word line potential WL, a precharge signal P and a sense amplifier enable signal SE. Also included are two digit line responses, one shown as (a) and another shown as (b). Response (a) shows an approach according to the present invention where the relationship of Expression 1 is met. Response (b) shows an approach where the relationship is not met, and illustrates a case where $$Ion=K*(n-1)*Ioff \qquad \text{(Expression 2).}$$

Referring now to FIG. 4 in conjunction with FIG. 2, response (a) illustrates a case where a data value is read when all the memory cells (200-1 to 200-n) store the same value. For example, assume that data is read from memory cell 200-1 and that node N1 of memory cell 200-1 is at a logic high (i.e., memory cell 200-1 stores a "1"). Further assume that the remaining de-selected memory cells (200-2 to 200-n) have nodes N2 that are at a logic low (i.e., memory cells 200-2 to 200-n store a "1"). A potential difference ΔV1 between digit lines 202-0 and 202-1 can develop as shown by the solid lines of response (a).

Response (a) also shows a case where a data value is read when all the deselected memory cells (200-1 to 200-n) store a different value than the selected memory cell. For example, assume that data is read from memory cell 200-1 and that node N1 of memory cell 200-1 is at a logic high (i.e., memory cell 200-1 stores a "1"). Further assume that the remaining de-selected memory cells (200-2 to 200-n) have nodes N2 that are at a logic high (i.e., memory cells 200-2 to 200-n store a "0"). A potential difference ΔV0 between digit lines 202-0 and 202-1 can develop as shown by the dashed lines of response (a).

It is noted that, despite the fact that the potential difference ΔV0 is less than ΔV1, a sufficient differential can be developed to allow for reliable and sufficient fast read operations. Thus, when the relationship of Expression 1 is met, data can be read by a sense amplifier circuit 208 without the drawbacks of previous approaches.

It is further noted that the number of memory cells connected to a digit line may be reduced by dividing a digit line pair (such as 202-0 and 202-1) in the longitudinal direction. Such an approach can reduce the loads presented by the digit lines and can increase the gradient of the potential differences indicated in response (a). In this way, sensing times can be shortened, allowing for higher speed responses.

As noted above, response (b) of FIG. 4 shows a case where the relationship of Expression 1 is not met.

Referring now to FIG. 4 in conjunction with FIG. 2, response (b) illustrates a case where a data value is read when all the memory cells (200-1 to 200-n) store the same value. For example, assume that data is read from memory cell 200-1 and that node N1 of memory cell 200-1 is at a logic high (i.e., memory cell 200-1 stores a "1"). Further assume that the remaining de-selected memory cells (200-2 to 200-n) have nodes N2 that are at a logic low (i.e., memory cells 200-2 to 200-n store a "1"). A potential difference ΔV1' between digit lines 202-0 and 202-1 can develop as shown by the solid lines of response (a). Such an arrangement may be sufficient for fast and reliable read operations. However, this may not be the case for all possible stored logic values.

Response (b) also shows a case where a data value is read when all the deselected memory cells (200-1 to 200-n) store a different value than the selected memory cell. For example, assume that data is read from memory cell 200-1 and that node N1 of memory cell 200-1 is at a logic high (i.e., memory cell 200-1 stores a "1"). Further assume that the remaining de-selected memory cells (200-2 to 200-n) have nodes N2 that are at a logic high (i.e., memory cells 200-2 to 200-n store a "0"). A potential difference ΔV0' between digit lines 202-0 and 202-1 can develop as shown by the dashed lines of response (b).

As shown by the ΔV0' measurement in response (b), the potential difference is almost zero. This can lead to erroneous read operations. Further, the potential difference does not increase over time.

It is also noted that reducing the number of memory cells connected to a digit line does not improve a response, as only the gradient would increase. Consequently, it would appear that read operations from four-transistor memory cells do not yield adequate results unless the relationship of the present invention (Ion>K*(n-1)*Ioff) is met. Further, it would also appear that if the "on" current of a selected memory cell (Ion) is less than the "off" currents (Ioff) of all the remaining de-selected (n-1) memory cells multiplied by the value K, read operations would be even worse, as a resulting potential difference could have an erroneous logic value.

Thus, for conventional SRAM circuits having four-transistor memory cells, experimentation had shown that dividing digit lines in a longitudinal direction did not enhance the speed and/or reliability of the SRAM circuit as long as the relationship of Expression 1 was not met. The reasons for such a result are explained by the discussion set forth above, and particularly by FIG. 4.

Figure 5:
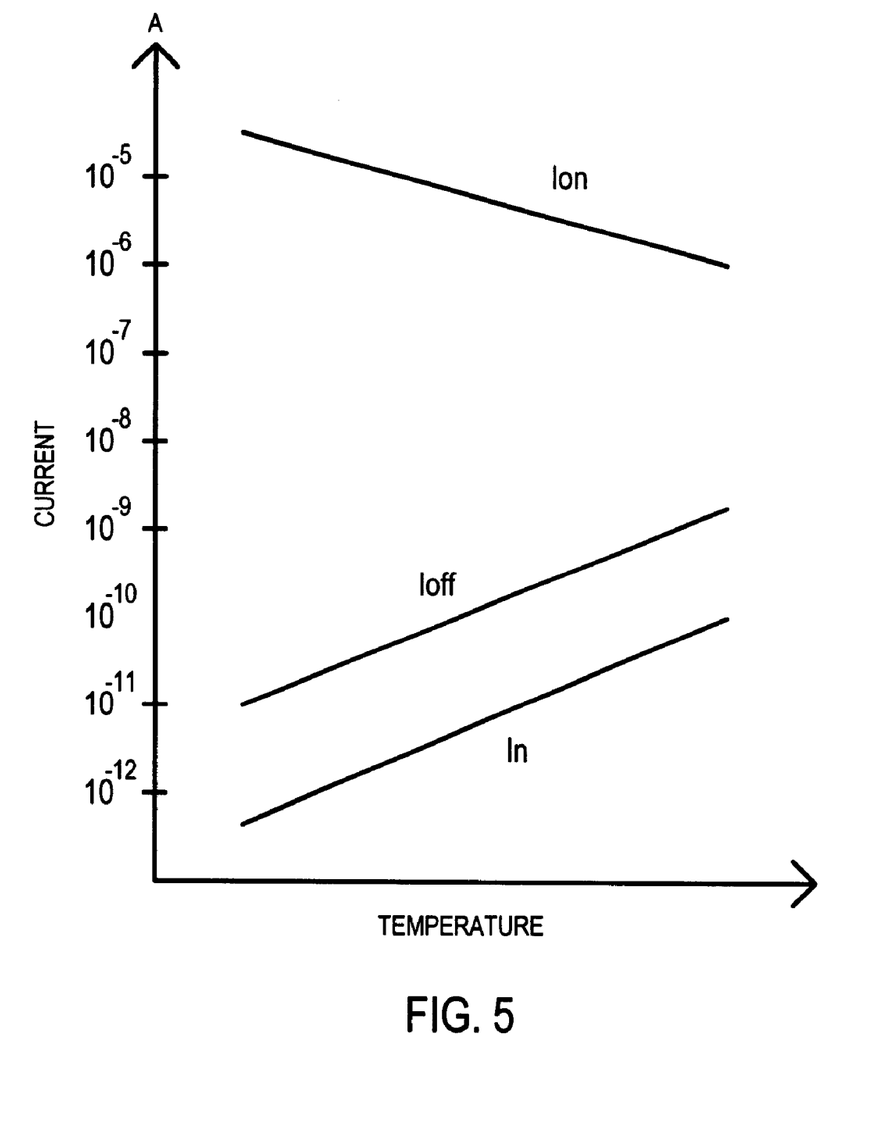
FIG. 5 is a graph showing the characteristics of a selected memory cell "on" current and de-selected memory cell "off" leakage current.

Referring now to FIG. 5, a graph is set forth illustrating a selected memory cell "on" current Ion and a selected memory cell "off" current Ioff. It is understood that in the particular example shown in FIG. 2, Ioff can essentially be the off current of a PMOS access transistor.

The particular graph of FIG. 5 shows current magnitudes with respect to temperature variations for a four-transistor memory cell formed with large scale integration (LSI) design rules for transistors having gate lengths of 0.18 $\mu$m. The particular current values shown are Ion, Ioff and In. In can be a leakage current for an n-channel device.

In FIG. 5, the current Ioff is about two orders of magnitude greater than the n-channel leakage current In. Further, the current Ion is about three orders of magnitude greater than the current Ioff. Thus, even where the coefficient K is 1, the number of memory cells (n) connected to the same digit line pair should be, in some embodiments, 1000 or less. Still further, due to variations in the fabrication of transistors within a four-transistor memory cell, particularly the fabrication of p-channel access transistors, the coefficient K may range from about 1 to about 10. Consequently, in such cases the number of transistors connected to the same digit line can be about 100.

One way to ensure the desired number of memory cells are connected to the same digit line can be to divide digit lines in the longitudinal direction to satisfy the relationship of Expression 1.

The embodiments of the present invention have described a SRAM circuit that includes four-transistor memory cells. The number of memory cells connected to a digit line pair is limited so that the current drawn by a selected memory cell is greater than the sum of the currents drawn by the non-selected memory cells on the same digit line pair. In one arrangement, digit lines can be divided in the longitudinal direction to thereby reduce the number of memory cells connected to the same digit line pair. In such an arrangement, a sufficient potential difference can be generated across digit line pairs for reliable read operations. In this way, the present invention provides a SRAM circuit with four-transistor memory cells that can perform read operations at high speed.

It is noted that the present invention can allow for highly integrated SRAM devices. More particularly, in SRAM circuits that include field effect transistors, advantages can be realized at transistor channel lengths less than 0.5 $\mu$m, more particularly less than 0.25 $\mu$m, even more particularly less than 0.2 $\mu$m.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A static random access memory (SRAM) circuit, comprising:
a number of n memory cells coupled to a digit line pair, where n is greater than 1, each memory cell including two driver transistors and two access transistors and drawing a current Ion when selected, and drawing a current Ioff when de-selected; wherein
the number n and Ion and Ioff values of the memory cells satisfies the relationship Ion>K*(n−1)*Ioff, where K is at least one.

2. The SRAM circuit of claim 1, wherein:
the SRAM circuit includes a memory cell array having a column that includes a plurality of digit line pairs arranged in a first direction and separated from one another in a second direction.

3. The SRAM circuit of claim 1, wherein:
the driver transistors within each memory cell include n-channel transistors having a cross-coupled gate-drain connections.

4. The SRAM circuit of claim 1, wherein:
the access transistors within each memory cell include p-channel transistors having gates connected to a word line.

5. The SRAM circuit of claim 1, wherein:
the value of K is in the general range of 1 to 10.

6. The SRAM circuit of claim 1, further including:
a precharge circuit that applies a predetermined potential to the digit line pair when the memory cells coupled to the digit line pair are de-selected.

7. A static random access memory (SRAM) device, comprising:
a plurality of memory cells each coupled to a digit line pair by a corresponding pair of access transistor, each memory cell having a de-selected state that maintains a stored data value by a leakage current flowing through one of the access transistors and a selected state that draws an on current through one of the access transistors, the on current of a selected memory cell coupled to the digit line pair being greater than the leakage current of the remaining de-selected memory cells coupled to the digit line pair.

8. The SRAM of claim 7, wherein;
the on current and leakage current have the following relationship
Ion>K*(n−1)*Ioff, where Ion is the on current, K is a value that is at least one, n is the number of memory cells coupled to the digit line pair, and Ioff is the leakage current.

9. The SRAM circuit of claim 8, wherein:
the value K is in the range of about 1 to 10.

10. The SRAM circuit of claim 7, wherein:
each memory cell includes no more than four circuit elements.

11. The SRAM circuit of claim 7, wherein:
each memory cell includes the two access transistors coupled to two driver transistors at two data nodes, one driver transistor driving one data node to one potential to store a logic value.

12. The SRAM circuit of claim 7, wherein:
the access transistors have channel lengths less than 0.5 $\mu$m.

13. The SRAM circuit of claim 7, further including:
a precharge circuit coupled to the digit line pair that maintains the digit line pair at a predetermined potential when all of the memory cells coupled to the digit line pair are de-selected.

14. A static random access memory (SRAM) circuit, comprising:
a digit line pair; and
n memory cells coupled to the digit line pair, each memory cell consisting of two access transistors and two driver transistors, each memory cell having a selected state in which the access transistors are turned on and an on current is drawn through one of the access transistors, each memory cell having a de-selected state in which the access transistors are turned off and a leakage current is drawn through one of the access transistors, the sum of all but one of the memory cell leakage currents being less than the on current of one memory cell.

15. The SRAM circuit of claim 14, wherein:

the on current and leakage currents have the following relationship: $Ion > K*(n-1)*Ioff$, where Ion is the on current, K is a number no less than one, and Ioff is the leakage current.

16. The SRAM circuit of claim 15, wherein:

K is dependent upon the characteristics of the access transistors.

17. The SRAM circuit of claim 15, wherein:

K is dependent upon the characteristics of the driver transistors.

18. The SRAM circuit of claim 15, wherein:

K is in the general range of 1 to 10.

19. The SRAM circuit of claim 14, wherein:

the access transistors are p-channel transistors having gate lengths less than 0.5 $\mu$m.

20. The SRAM circuit of claim 14, wherein:

the on current is no more than a thousand times greater than the leakage current.

* * * * *